(12) United States Patent
Moore et al.

(10) Patent No.: US 7,528,756 B2
(45) Date of Patent: May 5, 2009

(54) ANALOG-TO-DIGITAL CONVERTER SYSTEM WITH INCREASED SAMPLING FREQUENCY

(75) Inventors: Charles H. Moore, Sierra City, CA (US); Leslie O. Snively, Castle Rock, CO (US); John Huie, Scottsdale, AZ (US)

(73) Assignee: VNS Portfolio LLC, Cupertino, CA (US)

( * ) Notice: Subject to any disclaimer, the term of this patent is extended or adjusted under 35 U.S.C. 154(b) by 0 days.

(21) Appl. No.: 11/726,739

(22) Filed: Mar. 22, 2007

(65) Prior Publication Data

US 2008/0231489 A1   Sep. 25, 2008

(51) Int. Cl.
*H03M 1/12* (2006.01)
(52) U.S. Cl. ...................... 341/155; 341/156
(58) Field of Classification Search ................. 341/155, 341/156; 370/286, 352
See application file for complete search history.

(56) References Cited

U.S. PATENT DOCUMENTS

| | | | |
|---|---|---|---|
| 3,868,677 A | 2/1975 | Kidd .................... 340/347 AD |
| 4,665,494 A * | 5/1987 | Tanaka et al. ................. 702/77 |
| 6,081,215 A | 6/2000 | Kost et al. .................... 341/120 |
| 6,094,030 A * | 7/2000 | Gunthorpe et al. .......... 320/116 |
| 6,236,645 B1 * | 5/2001 | Agazzi ........................ 370/286 |
| 6,522,282 B1 | 2/2003 | Elbornsson ................. 341/155 |
| 7,084,793 B2 | 8/2006 | Elbornsson ................. 341/118 |
| 2003/0035549 A1 | 2/2003 | Bizjak et al. .................. 381/56 |
| 2004/0095264 A1 | 5/2004 | Thomas ........................ 341/53 |
| 2005/0034029 A1 * | 2/2005 | Ramberg et al. .............. 714/43 |
| 2005/0182581 A1 * | 8/2005 | Hashemian .................. 702/105 |
| 2006/0082445 A1 | 4/2006 | O'Toole et al. ............. 340/10.4 |
| 2006/0097901 A1 | 5/2006 | Draxelmayr et al. ........ 341/155 |
| 2006/0279445 A1 | 12/2006 | Kinyua et al. ............... 341/155 |
| 2006/0279969 A1 | 12/2006 | Leung et al. .................. 363/41 |
| 2006/0279970 A1 | 12/2006 | Kernahan ..................... 363/65 |
| 2007/0035611 A1 * | 2/2007 | Wu .......................... 348/14.01 |
| 2007/0036150 A1 * | 2/2007 | Pounds et al. ............... 370/352 |

OTHER PUBLICATIONS

Daihong Fu et al., *A Digital Background Calibration Technique For Time-Interleaved Analog-To-Digital Converters*; IEEE Journal of Solid-State Circuits, vol. 33, No. 12, Dec. 1998.

(Continued)

*Primary Examiner*—Jean B Jeanglaude
(74) *Attorney, Agent, or Firm*—Henneman & Associates, PLC; Larry E. Henneman, Jr.

(57) ABSTRACT

An improvement in sampling a high frequency input analog signal and converting it to a digital output signal is accomplished by using a multitude of analog-to-digital converters in conjunction with a distributed sampling system. This combination of multiple converters and a distributed sampling system allows use of conventional device processing, such as that of 0.18 micron silicon, and also provides accurate sampling of very high frequency input signals. The distributed sampling system provides multiple samplings of the input signal by using a different ADC for each sampling, wherein each sampling is sequentially offset a certain amount of time from the most recent preceding sampling. The samplings from the multitude of ADCs are combined to form a single contiguous digital output signal. Types of distributed sampling systems include a multitude of elongated trace patterns interconnected in series, a specified permittivity material device, and a sequencer or multiplier.

62 Claims, 15 Drawing Sheets

OTHER PUBLICATIONS

Jonas Elbornsson, PhD., *White Paper On Parallel Successive Approximation ADC*; MathCore Engineering AB, Oct. 18, 2005.

Ian King, *Capturing Data From Gigasample Analog-To-Digital Converters*, I/Omagazine, Jan. 2006.

Kevin Nary, *Design Of A High-Performance Analog-To-Digital Converter*; Publication date unknown.

Loumeau et al. "Analog to Digital Conversion: Technical Aspects." Annales des Telecommunications, vol. 57, No. 5-6. Published Jun. 3, 2002. pp. 338-385.

Nauta et al. "Analog/RF Circuit Design Techniques for Nanometerscale IC Technologies." Proceedings of the 31st European Solid-State Circuits Conference, 2005. Published Sep. 12, 2005. pp. 45-53.

* cited by examiner

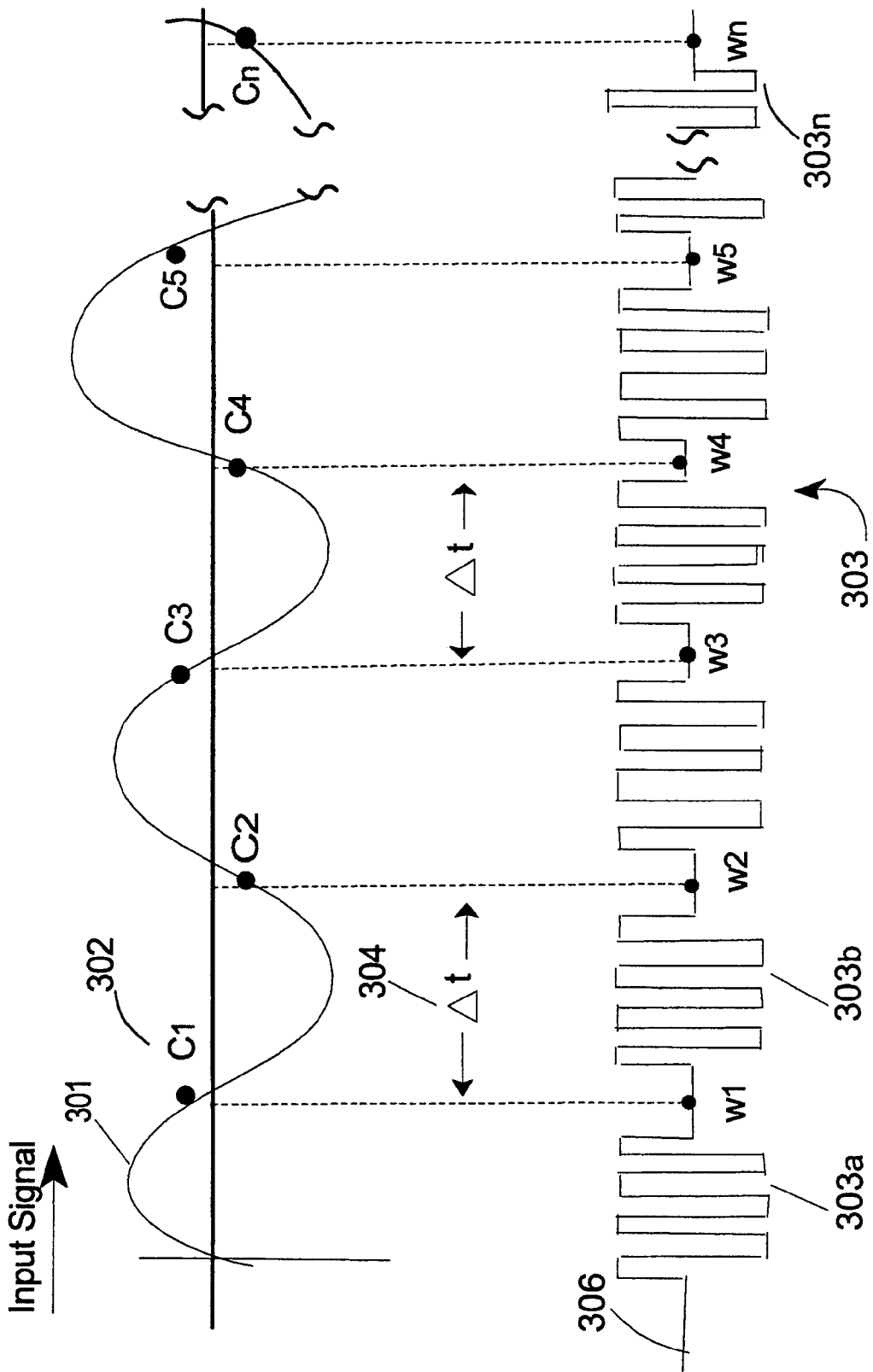

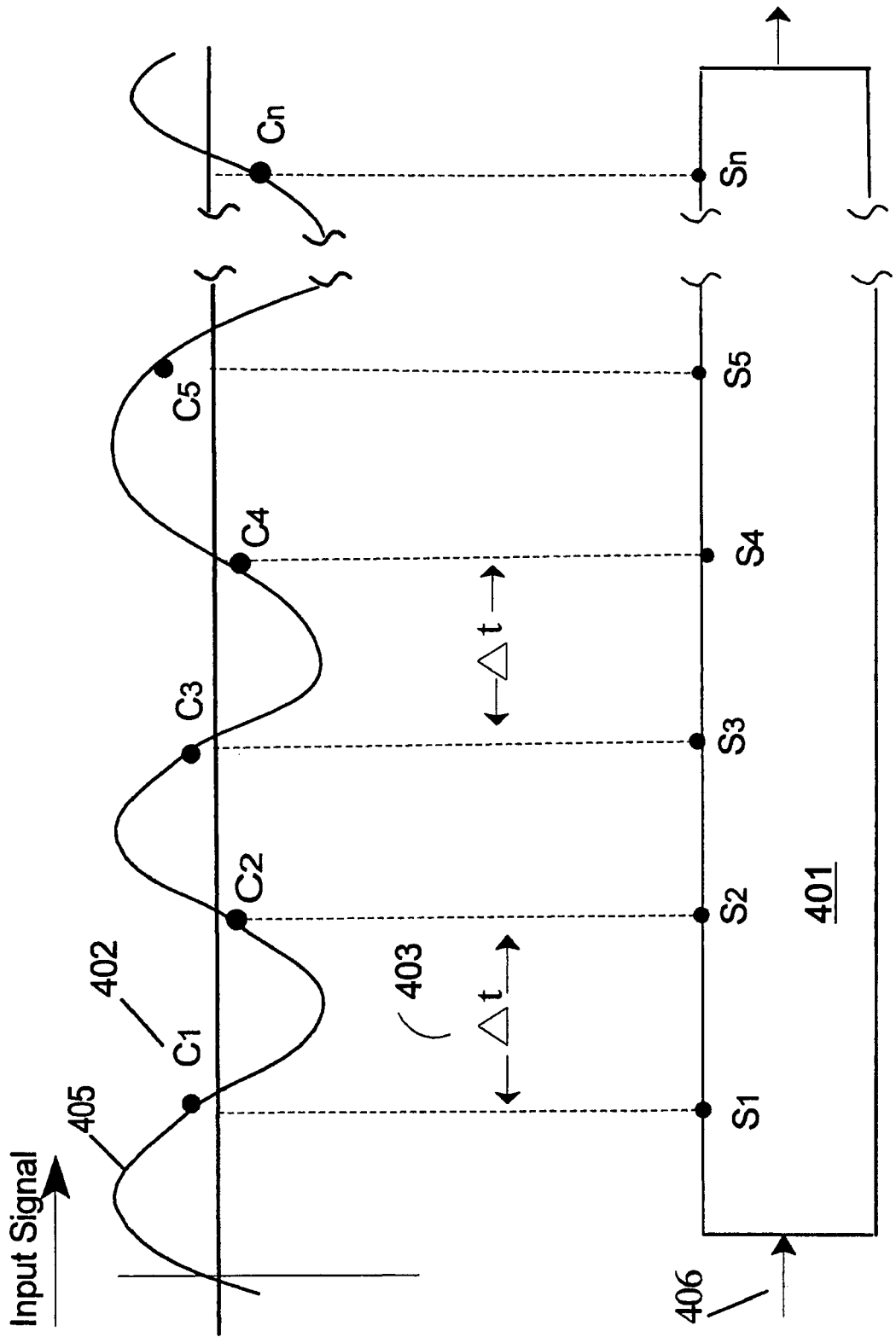

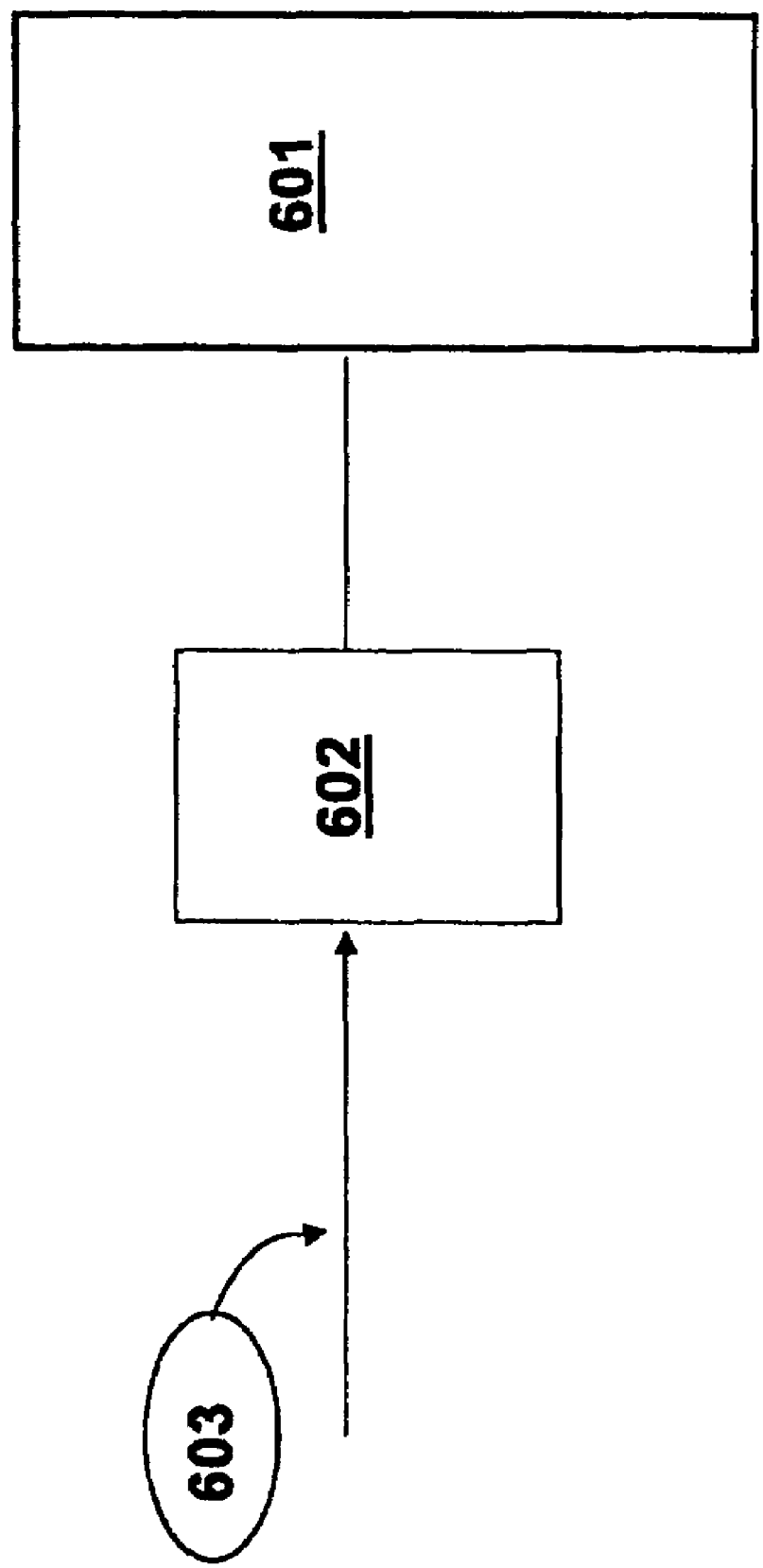

ANALOG-TO-DIGITAL CONVERTER SYSTEM WITH INCREASED SAMPLING FREQUENCY

BACKGROUND OF THE INVENTION

1. Field of the Invention

The present invention relates to the field of computers and computer processors, and more particularly to analog-to-digital converters (ADCs).

2. Description of the Background Art

An analog-to-digital converter (ADC) is an electronic circuit that converts continuous signals to discrete digital numbers. Typically, an ADC is an electronic device that converts an input analog voltage to a digital number.

The analog signal is continuous in time and it is necessary to convert this to a flow of digital values. It is therefore required to define the rate at which new digital values are sampled from the analog signal. The rate of new values is called the sampling rate or sampling frequency of the converter, typically reported as the number of samples per second (sps).

A continuously varying bandlimited signal can be sampled at intervals of time T, the sampling time, and measured and stored, and then the original signal can be approximately reproduced from the discrete-time values by an interpolation formula. This reproduction achieves maximum possible accuracy only if the sampling rate is higher than twice the highest frequency of the signal, which is called the Nyquist-Shannon sampling theorem.

Since a practical ADC cannot make an instantaneous conversion, the input value must necessarily be held constant during the time that the converter performs a conversion, called the conversion time. An input circuit called a sample and hold performs this task, usually by using a capacitor to store the analog voltage at the input, and using an electronic switch or gate to disconnect the capacitor from the input. Many ADC integrated circuits include the sample and hold subsystem internally.

It is often desirable to be able to sample analog signals in an integrated circuit (IC) at very high frequencies, for example in the range of several gigahertz (GHz). However, certain types of ICs are made with older semiconductor manufacturing and material technology that is capable of sampling signals only at lower frequencies, for example in the range of 1-2 GHz or less. It would be desirable to utilize this older technology and still achieve very high frequency sampling rates.

FIG. 1 shows an overview of an analog-to-digital (A-to-D) sampling system 100 as is currently known in the art. Embedded in a chip 101 is an A-to-D block 102. A-to-D block 102 has a data output 105, typically a parallel bus, and a sampling frequency control 104, which is used to control sampling of the input signal 103. The highest frequency component of the input signal is designated as $f_i$, and the sampling frequency, designated as $f_s$ must be at least twice the frequency of $f_i$, preferably 2.2 times the frequency of $f_i$ for sampling that retains the maximum information about the original signal as possible. Therefore, if the desired input frequency $f_i$ is in the 10 GHz range, the chip must be able to clock the sampling frequency $f_{s\ at}$ approximately 20-22 GHz. Building a chip with such a high sampling frequency is more costly, and the architecture of such chips does not permit embedding of large data functions such as CPUs, memory, etc. in such a chip.

Various approaches have been taken to find an economical system that can sample high frequency input rates. In an article entitled, *Design of a High-Performance Analog-to-Digital Converter*, by Kevin Nary, published in CSD Magazine in October 1998, Nary discloses a folding and interpolating 8-bit 2-Gsps ADC. The number of comparators required for a 4-bit ADC is reduced from fifteen to six when switching from a flash to a folding architecture. This ADC increases the analog bandwidth and the maximum sample rate and consumes less power than a flash architecture ADC. One method of achieving a folding function uses cross-coupled, differential amplifiers, where a single fold is achieved with two cross-coupled, differential amplifiers. By adding more resistors and differential pairs, the number of folds may be increased. Nary reported results of a 2 GHz sampling frequency with 98 MHz input frequency.

Another approach has been disclosed in an article entitled, *Capturing Data from Gigasample Analog-to-Digital Converters*, by Ian King, published in I/O Magazine in January 2006, which discloses a method of de-multiplexing the digital output. For a 1.5 GHz sample rate, the conversion data will be output synchronous to a 750 MHz clock, where the data is presented to the outputs on both the rising and falling edges of the clock. Two latches are then used, wherein one latch is clocked on the rising edge of the phase-locked data clock and a second latch is clocked using a signal that is 180 degrees out of phase. This reduces the output to 375 MHz. After latching the incoming data, the clock domain is shifted using an intermediate set of latches so that all of the data can be clocked into a memory array on the same clock edge, which de-multiplexes the data rate to 187.5 MHz. A single-channel device can be put into a dual-edge sampling mode to increase the sampling speed from 1.5 Gsps to 3.0 Gsps, which increases the number of output data bits from 8 to 16.

A system and method are clearly needed in which much higher sampling frequencies than 2-3 GHz can be adequately sampled, which uses conventional lower cost semiconductor manufacturing and material technology.

SUMMARY OF THE INVENTION

It is an object of the present invention to adequately sample a very high frequency input analog signal, which is converted to a digital signal using conventional lower frequency analog-to-digital devices and processes. This objective is achieved through a system of multiple analog-to-digital converters (ADCs).

The presently described invention includes a chip with several ADCs and central processing units (CPUs), and a distributed sampling system. Each ADC works in conjunction with a designated CPU to form an ADC system. Each individual ADC system may contain conventional devices formed from 0.18 micron silicon, as an example. In this example, such individual systems are capable of sampling signals in the range of 1-2 GHz or less.

The present invention describes how multiple conventional devices can be used to adequately sample a very high frequency input signal. A timing signal is passed along the chip through a distributed sampling system, also called a delay sampling system or a relay sampling system. When the timing signal reaches a first designated point along the distributed sampling system, a first ADC samples an input signal. When the timing signal reaches a second designated point along the distributed sampling system, a second ADC samples the input signal. The timing signal continues through the distributed sampling system until an established number of samplings have been taken by the same established number of ADC systems.

The timing signal is passed along the chip through the distributed sampling system, such that the occurrence of each subsequent sampling occurs at a clocked amount of time after the previous sampling. This is achieved by a plurality of sequential sampling prompts or taps originating from the distributed sampling system as the timing signal travels through the system. This results in cumulative samplings of the high frequency input signal by several ADCs, such that an adequate sampling necessary for optimum Nyquist-Shannon sampling is achieved. For example, if it is desired to adequately sample an input signal of 10 GHz using conventional systems capable of only 1 GHz sampling, then 20 ADC systems would be necessary in order to sequentially sample the input analog signal, wherein each ADC system obtains a sampling at a clocked 50 psec interval after the previous sampling. The sampling results of all 20 ADC systems are combined to obtain a result that is equivalent to a single ADC system that is capable of sampling at 20 GHz.

Several distributed sampling systems are described. One such distributed sampling system includes several elongated trace patterns or additional lengths of wire, which are electrically interconnected in series. A timing signal travels through a first additional length of wire, after which a timing signal tap or prompt causes a sampling of the input signal to be taken by a first ADC system, which occurs at a specified period of time, given by $\Delta t$. The timing signal continues through a second additional length of wire, after which a timing signal tap or prompt causes a second sampling of the input signal to be taken by a second ADC system, which occurs after a second period of time, $\Delta t$. The timing signal continues through an established number of lengths of wire which causes a cumulative sampling from the same established number of ADC systems. The results of the cumulative samplings are combined to produce a single contiguous digital output signal.

Another distributed sampling system includes a specified permittivity material device, such as a SAW device. The material of the device determines the rate at which a timing signal travels through it. Samples of an input analog signal are taken by a plurality of ADC systems when a timing signal reaches a plurality of equi-distant points along the device. The results of the sequential samplings are combined to obtain a single contiguous digital output signal.

Another distributed sampling system uses a sequencer or multiplier, such that a timing signal is multiplied a set number of times in order to produce an incremental period of time, $\Delta t$ for each stage. The ADC systems sample an input analog signal after each period of time, $\Delta t$. The input signal sampling results from the multiplier sampling system are combined to obtain a single contiguous digital output signal.

An ADC differential op amp circuit diagram is also described, which provides large common mode rejection. By sampling the input signal out of phase, the input signal is completely differentiated and set apart from the background noise. This provides a cleaner signal, and therefore more accurate sampling results.

These and other objects and advantages of the present invention will become clear to those skilled in the art in view of the description of modes of carrying out the invention, and the industrial applicability thereof, as described herein and as illustrated in the several figures of the drawings. The objects and advantages listed are not an exhaustive list of all possible advantages of the invention. Moreover, it will be possible to practice the invention even where one or more of the intended objects and/or advantages might be absent or not required in the application.

Furthermore, those skilled in the art will recognize that various embodiments of the present invention may achieve one or more, but not necessarily all, of the described objects and/or advantages. Accordingly, the objects and/or advantages described herein are not essential elements of the present invention, and should not be construed as limitations.

BRIEF DESCRIPTION OF THE DRAWINGS

FIGS. 3a-3b are representations of the timing relationship between samplings taken of an input analog signal and taps made in a timing signal distributed line according to a first embodiment of the presently described invention;

FIG. 4 is a representation of the timing relationship between samplings taken of an input analog signal and taps made in a timing signal distributed line according to a second embodiment of the presently described invention;

FIGS. 5-6 are block diagrammatic views of a third embodiment of the presently described invention;

DETAILED DESCRIPTION

Figure 1:
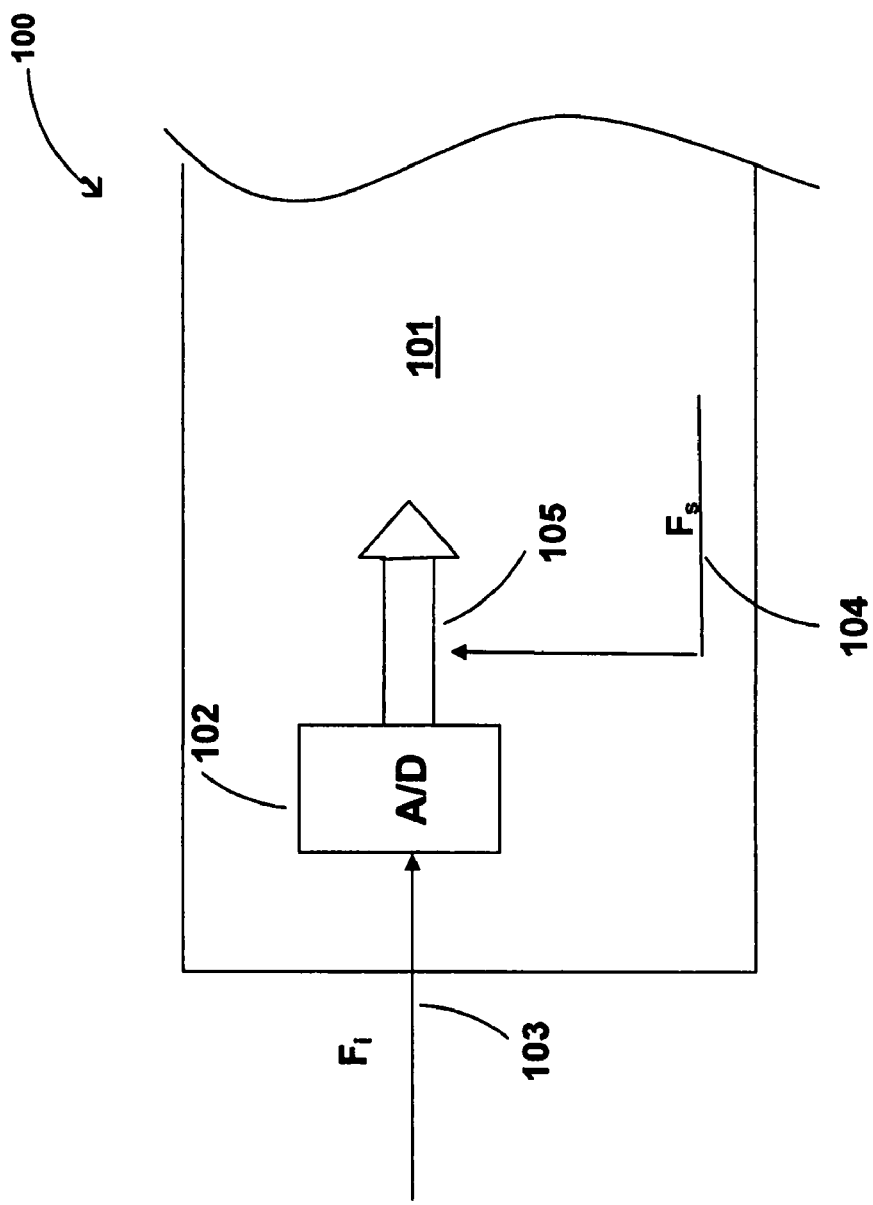
FIG. 1 is a block diagrammatic view of a conventional ADC system.

This invention is described with reference to the figures, in which like numbers represent the same or similar elements. While this invention is described in terms of modes for achieving this invention's objectives, it will be appreciated by those skilled in the art that variations may be accomplished in view of these teachings without deviating from the spirit or scope of the presently claimed invention.

The embodiments and variations of the invention described herein, and/or shown in the drawings, are presented by way of example only and are not limiting as to the scope of the invention. Unless otherwise specifically stated, individual aspects and components of the invention may be omitted or modified for a variety of applications while remaining within the spirit and scope of the claimed invention, since it is intended that the present invention is adaptable to many variations.

Figure 2:
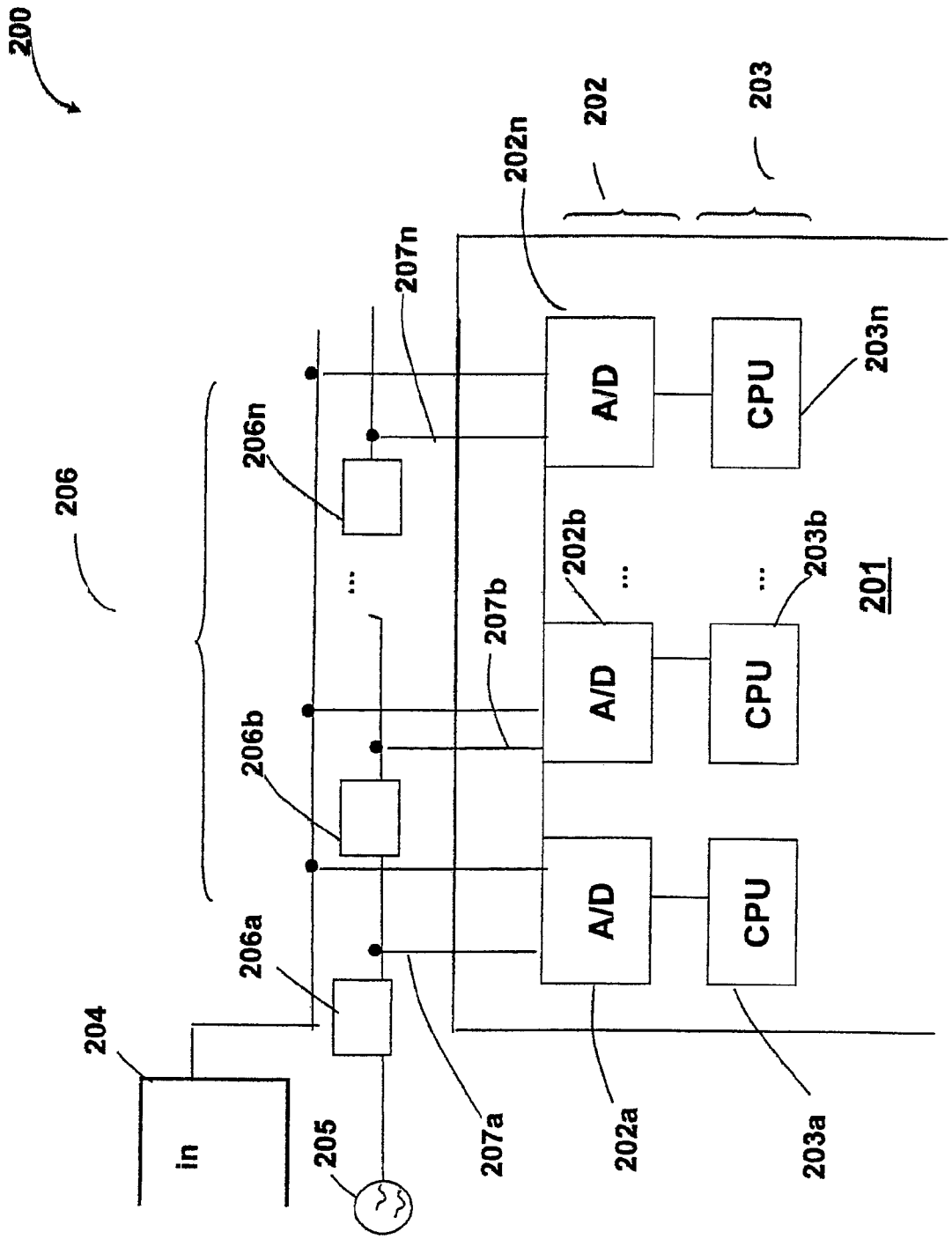
FIG. 2 is a block diagrammatic view of a general ADC system according to the present invention.

FIG. 2 shows an example of an ADC system 200 according to the present invention. An input signal 204 is passed into a number of analog-to-digital converter cells $202_a$ through $202_n$ of a chip 201. An external sampling clock 205 is shown in this example, but an internal clock could have been utilized as well. The sampling clock 205 is run at a substantially lower frequency, for example, 10 or 20 times lower frequency, than the intended sampling rate. By providing sequential time periods from time distribution apparatus $206_a$ through $206_n$, it is possible to increase the net sampling rate by n number of times. In this example, the time periods are provided by an external source, although as discussed above, an internal timing source could also be utilized. If the input signal 204 is required to be sampled with a resolution up to 10 GHz, then a sampling clock 205 at 20 or 22 GHz would be necessary for optimum Nyquist-Shannon sampling. However, in the present inventive system, the sampling clock 205 can run at, for example, 1 GHz for n=20 or 22, respectively. The time periods, provided by the time distribution apparatus $206_a$ through $206_n$ would be in an increment of 1/20, 1/22, or similar increment of the sampling frequency, so that each ADC 202 would sample the input signal 204 at a slightly delayed point, resulting in a sampling that would be equivalent to using a single ADC, sampling at a rate of 20 or 22 GHz. The time periods, provided by the time distribution apparatus $206_a$ through $206_n$, occur as a result of tap line connections $207_a$ through $207_n$ between an individual distribution station (such as $206_a$) and a corresponding individual ADC (such as A/D $202_a$). When a timing signal (produced by sampling clock 205) travels through a plurality of serially connected distribution stations or distribution apparatus $206_a$ through $206_n$, a series of taps or sampling prompts are sent through tap line connections $207_a$ through $207_n$ to corresponding ADCs $202_a$ through $202_n$, respectively.

It is clear that such an approach would require a multitude of ADCs or A-to-D channels 202, for example, in this case at least 20 or 22, but it would allow use of an older technology chip 201, for example 0.18 micron silicon, and it would permit sampling of signals running in the 10 GHz range or thereabouts. By increasing the number of A-to-D channels 202 even more, the sampled signal frequency (or its highest Fourier Transform component) could be even further increased.

Names of items $202_a$ through $202_n$ as ADCs, converter cells, or channels have been used in this example interchangeably. Typically, to be able to process the amount of data without losing sample data during processing, each A-to-D channel 202 must have sufficient data transfer capabilities, for example its own CPU $203_a$ through $203_n$ corresponding to A-to-D channels $202_a$ through $202_n$.

The time period between each ADC sampling of the input signal could be achieved in various ways, as exemplified by the following embodiments. FIG. 3a discloses a time relationship between samplings taken of an input signal 301 and taps in a trace pattern 303 of a time distributed sampling system in a first embodiment of the invention. The trace pattern 303 contains a plurality of elongated wires connected in series. This time distributed sampling system has a plurality of ADC systems, wherein each ADC system comprises an ADC 202 and an associated central processing unit (CPU) 203, as discussed previously in relation to FIG. 2. When a timing signal 306 travels through a first length of wire 303a to a tap point of $W_1$, a prompt to sample the input signal 301 after a measurable amount of time, given by $\Delta t$ 304 is made. This timing is represented as ADC sampling point $C_1$. As the timing signal 306 continues through a second length of wire 303b to a second tap point of $W_2$, a prompt to sample the input signal 301 after a second period of time, $\Delta t$ is made. This timing is represented by ADC sampling point $C_2$. A separate ADC system samples the input signal 301 after the timing signal 306 reaches each trace pattern 303 at tap points, $W_1$ through $W_n$ for each tap in the distribution line. The results of the sequential samplings are combined to obtain a single contiguous digital output signal.

A more detailed explanation follows with reference to FIG. 3a. A timing signal 306 passes through a first length of wire, 303a to a tap point, $W_1$. At that point in time, an input signal 301 is sampled by a first ADC system, represented in time by the ADC sampling point, $C_1$. When the timing signal 306 travels through a second length of wire, 303b to a tap point represented by $W_2$, the input signal 301 is sampled by a second ADC system, at the ADC sampling point, $C_2$. The above described distributed sampling system continues to sample the input signal 301 at ADC sampling points 302, designated in time by $C_1$, $C_2$, etc. The input signal 301 is sampled after each sequential time period, $\Delta t$ 304 as the timing signal 306 travels through the plurality of lengths of wire 303. A number of ADC systems are established on a chip in order to adequately sample an input signal 301 in order to meet the Nyquist-Shannon requirement.

Consider the following example, which is given to further clarify the present invention, wherein the given example is not to be construed as a limiting feature. If, for example, an input signal 301 of 10 GHz frequency was to be sampled, then the time difference 304 between ADC sampling points 302 would need to be at least 50 psec to meet the Nyquist-Shannon requirement for an adequate sampling rate of a 10 GHz input signal. Each successive ADC system would sample the input signal 301 at the sampling points $C_1$, $C_2$, etc., wherein each sampling would occur at 50 psec after the previous ADC sampling. The ADC sampling points 302 correspond in time to successive tap points of $W_1$, $W_2$, etc. along the trace pattern 303. If each ADC system was capable of capturing or taking a sample every 1 nsec, then a total of 20 ADC systems would be necessary to adequately sample an incoming 10 GHz signal. In this example, the distributed sampling system using multiple lengths of interconnected wires of the presently described invention is equivalent to using a single ADC, which is capable of sampling an input signal of 10 GHz at a sampling rate of 20 gsps.

Figure 3B:
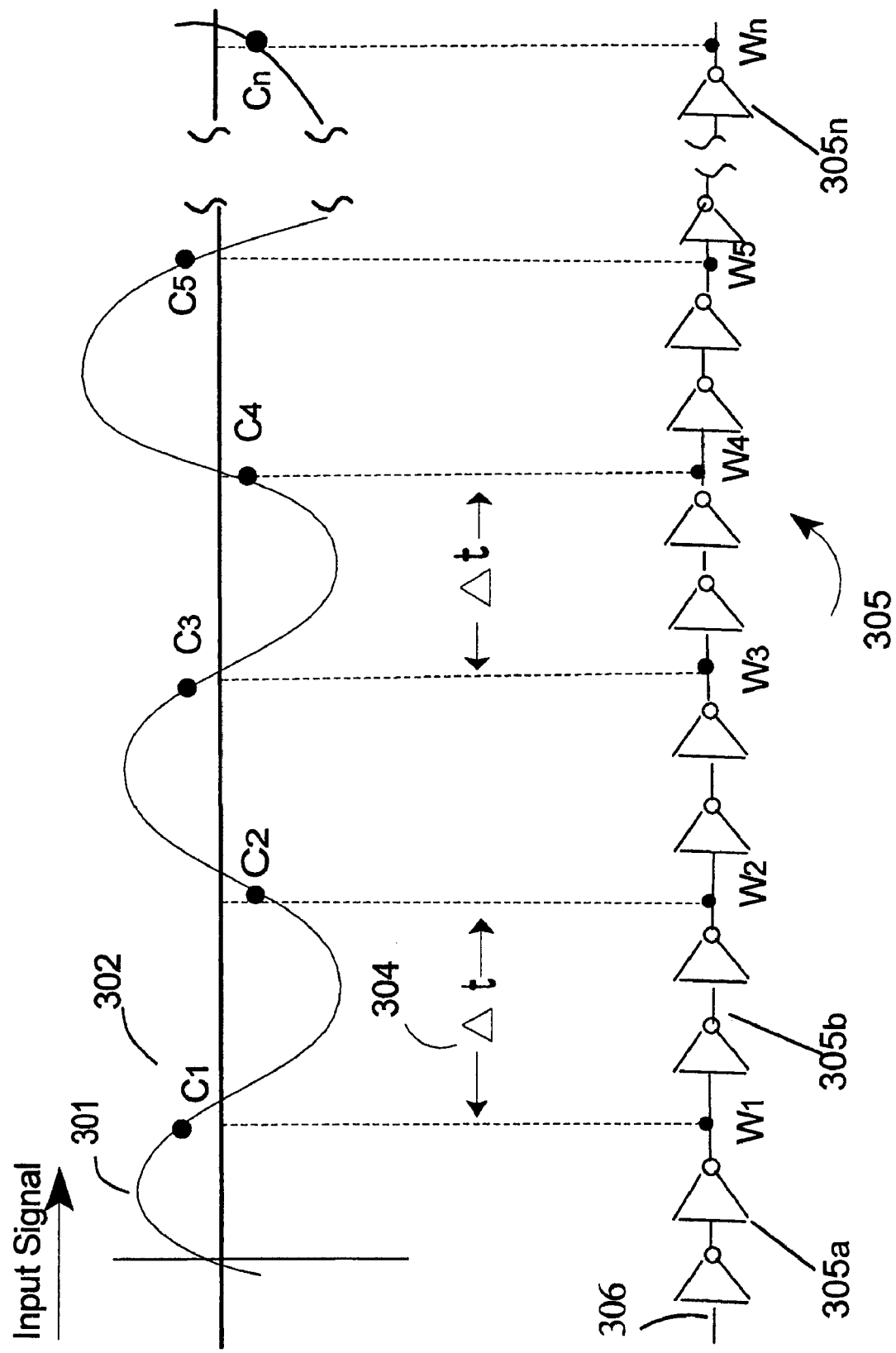

FIG. 3b discloses a time relationship between samplings taken of an input signal 301 and taps made in a connected series of inverter pairs 305 of a time distributed sampling system in a second embodiment of the invention. Each clocked trace pattern 303 of FIG. 3a is replaced with a pair of inverters 305 in FIG. 3b. A timing signal 306 travels through a series of connected inverter pairs 305. When the timing signal 306 travels through a first inverter pair 305a, a prompt to sample the input signal 301 after a first time period, $\Delta t$ 304 is made, which coincides with the ADC sampling point $C_1$. As the timing signal 306 continues through a second inverter pair 305b, a prompt to sample the input signal 301 after a second time period, $\Delta t$ 304 is made, which coincides with the ADC sampling point, $C_2$. A separate ADC system samples the input signal 301 at each of the ADC sampling points, $C_1$ through $C_n$ which occurs when the timing signal 306 travels through each inverter pair at points designated by $W_1$ through $W_n$, respectively. The results of the sequential samplings are combined to obtain a single contiguous digital output signal.

A more detailed explanation follows with reference to FIG. 3b. When a timing signal 306 travels through a first inverter pair, 305a to a tap point represented by $W_1$, an input signal 301 is sampled by a first ADC system at a first ADC sampling point, designated in time by $C_1$. When the timing signal 306 travels through a second inverter pair, 305b to a tap point represented by $W_2$, the input signal 301 is sampled by a second ADC system at a second ADC sampling point, $C_2$. The above given distributed sampling system continues to sample the input signal 301 as the timing signal 306 travels through the plurality of inverter pairs 305. As the timing signal 306 travels through each of the inverter pairs 305, the input signal 301 is sampled after each sequential time period, $\Delta t$ 304 at each ADC sampling point 302. A number of ADC systems are established on a chip in order to adequately sample an input signal 301 in order to meet the Nyquist-Shannon requirement.

FIG. 4 discloses a time relationship between samplings taken of an input analog signal 405 and line taps made in a specific permittivity material device 401 in a third embodiment of the invention. The time distribution sampling is achieved through the use of a specific permittivity material device 401, such as a surface acoustic wave (SAW) device. An input signal 405 is sampled after each measurable time period, Δt 403 as a timing signal 406 travels past each equidistant point, given by $S_1$ through $S_n$ along the device 401.

The specific permittivity material device distributed sampling system represented by FIG. 4 works similar to the trace distributed sampling system of FIG. 3*a*. A separate ADC system contains an ADC and a corresponding CPU, as previously described with reference to FIG. 2. Each sequential ADC system samples the input signal 405, represented by ADC sampling points 402 when a timing signal 406 reaches each sequential equi-distant point along the device 401, corresponding to points $S_1$ through $S_n$. As the timing signal 406 travels through the device 401, a prompt to sample the input signal 405 after each incremental time period, Δt 403 is made, wherein the value of Δt 403 is determined by the specific material of the device 401. When the timing signal 406 reaches a first sampling point 402 given by $S_1$, a prompt to sample the input signal 405 by a first ADC system at a first ADC sampling point, $C_1$ is made. When the timing signal 406 reaches a second sampling point, $S_2$ within the device 401 after a second time period, Δt 403 a second ADC system is prompted to sample the input signal 405 at the corresponding second ADC sampling point, $C_2$. The above described distributed sampling system continues to sample the input signal 405 at ADC sampling points 402, which correspond in time to points, $S_1$ through $S_n$ of the device 401. The results of the sequential samplings are combined to obtain a single contiguous digital output signal.

In an example using an input signal 405 of 10 GHz, a timing signal 406 travels to a first point, given by $S_1$ within the device 401. At this point, a first ADC system is prompted to sample the input signal 405 at the first ADC sampling point $C_1$ after a first time period 403 of 50 psec. When the timing signal 406 travels to a second point $S_2$ within the device 401, a second ADC system is prompted to sample the input signal 405 at a second sampling point, $C_2$ which will occur after a second time period 403 of 50 psec. If each ADC system sampled the input signal 405 at a rate of 1 nsec, then 20 ADC systems would be required to adequately sample an input signal 405 of 10 GHz. In this example, the distributed sampling system using a specific permittivity material device of the presently described invention is equivalent to using a single ADC, which is capable of sampling an input signal of 10 GHz at a sampling rate of 20 gsps.

Figure 5:
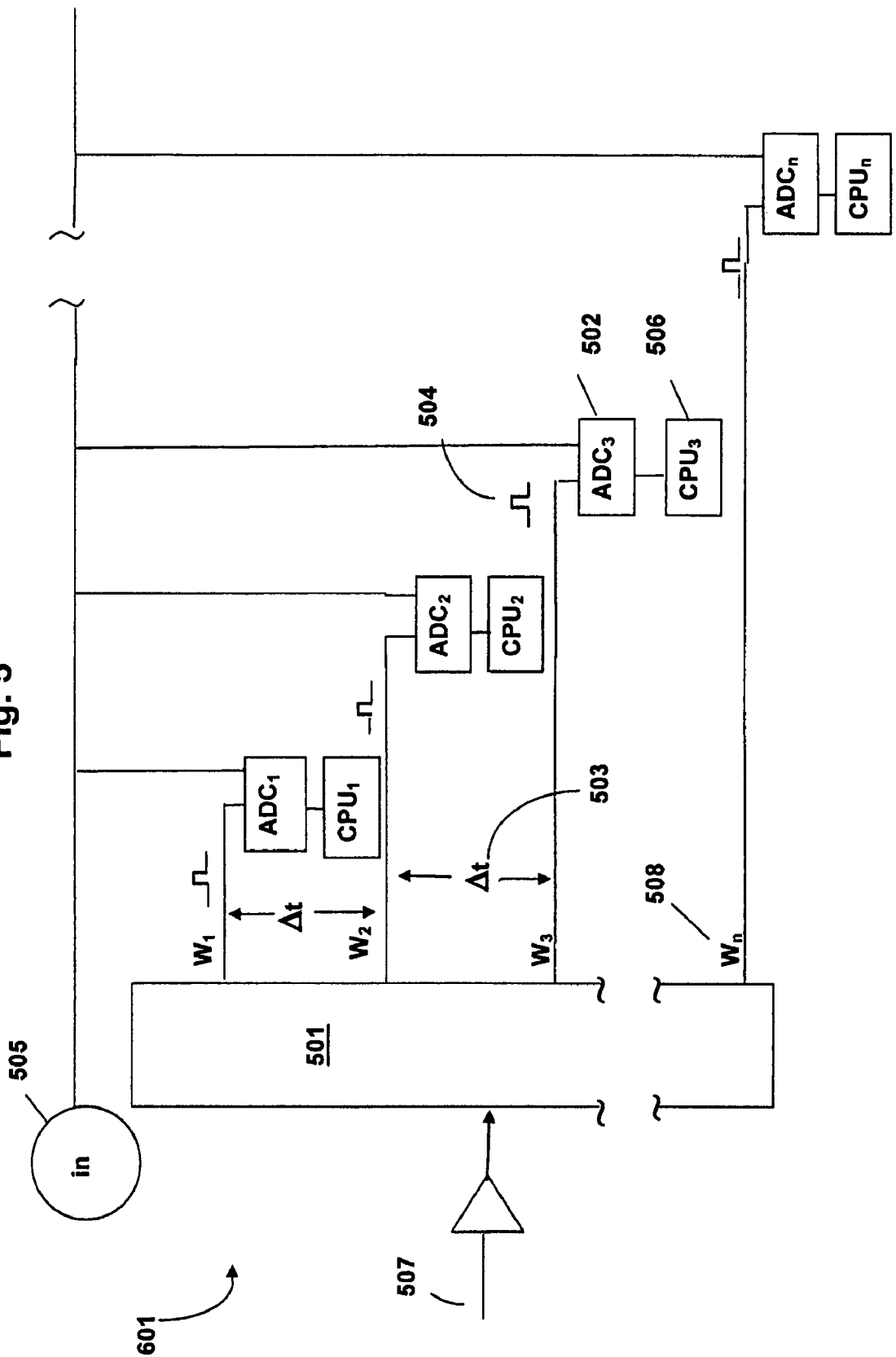

A fourth embodiment discloses a sequencer or multiplier distributed sampling system 601, and is described with reference to FIG. 5. An example of a sequencer distribution sampling system 601 could use an emitter coupled logic (ECL) as a sequencer 501. The sequencer 501 comprises a group of triggers 508 which are represented by $w_1$ through $w_n$. Each trigger 508 is connected to an ADC 502, each of which is then connected to an associated CPU 506. A timing signal 507 enters the sequencer 501, then each stage sequences or multiplies the timing signal 507 by the same incremental amount, given by Δt 503. Therefore, as a pulse 504 travels through a first ADC trigger, $w_1$ the input signal 505 is sampled by $ADC_1$. After a second time period Δt 503, a pulse 504 travels through a second ADC trigger, $w_2$ wherein the input signal 505 is sampled by $ADC_2$. The above described distributed sampling system continues to sample the input signal 505 by utilizing n number of triggers, $w_1$ through $w_n$ and using $ADC_1$ through $ADC_n$ converters, respectively. The sampling results are processed by n number of associated CPUs 506. The results of the sequential samplings are combined to obtain a single contiguous digital output signal. An important feature of the sequencer 501 is that time between each trigger 508 can be varied.

In an example of a 10 GHz input signal 505, the sequencer 501 comprises 20 triggers 508, as represented by $w_1$ through $w_{20}$. The input analog signal 505 will be sequentially sampled at intervals of 50 psec time periods, Δt 503. For example, $ADC_1$ will sample the input analog signal 505 when a pulse 504 travels through a first ADC trigger, $w_1$ after a first time period, Δt 503 of 50 psec. Then $ADC_2$ will sample the input analog signal 505 when a pulse 504 travels through a second ADC trigger, $w_2$ after a second time period, Δt 503 of 50 psec. If each ADC 502 is capable of sampling an input analog signal 505 at a rate of 1 nsec, then 20 triggers 508 along with 20 associated ADCs 502 and 20 associated CPUs 506 would be necessary to adequately sample a 10 GHz input signal 505 at a sampling rate of 20 gsps. In this example, the distributed sampling system using multiple ADCs with a sequencer or multiplier of the presently described invention is equivalent to using a single ADC, which is capable of sampling an input signal of 10 GHz at a sampling rate of 20 gsps.

FIG. 6 is a block diagram of a sequencer or multiplier distributed sampling system 601 which was described with reference to FIG. 5, with the addition of a clock generating block 602. The clock generating block 602 could be internal or external, and could include, but is not limited to a phase locked loop (PLL), a delay locked loop (DLL), a voltage controlled oscillator (VCO), a ring oscillator, a crystal oscillator, or other type of oscillator. FIG. 6 also shows a timing signal 603.

Figure 7A:
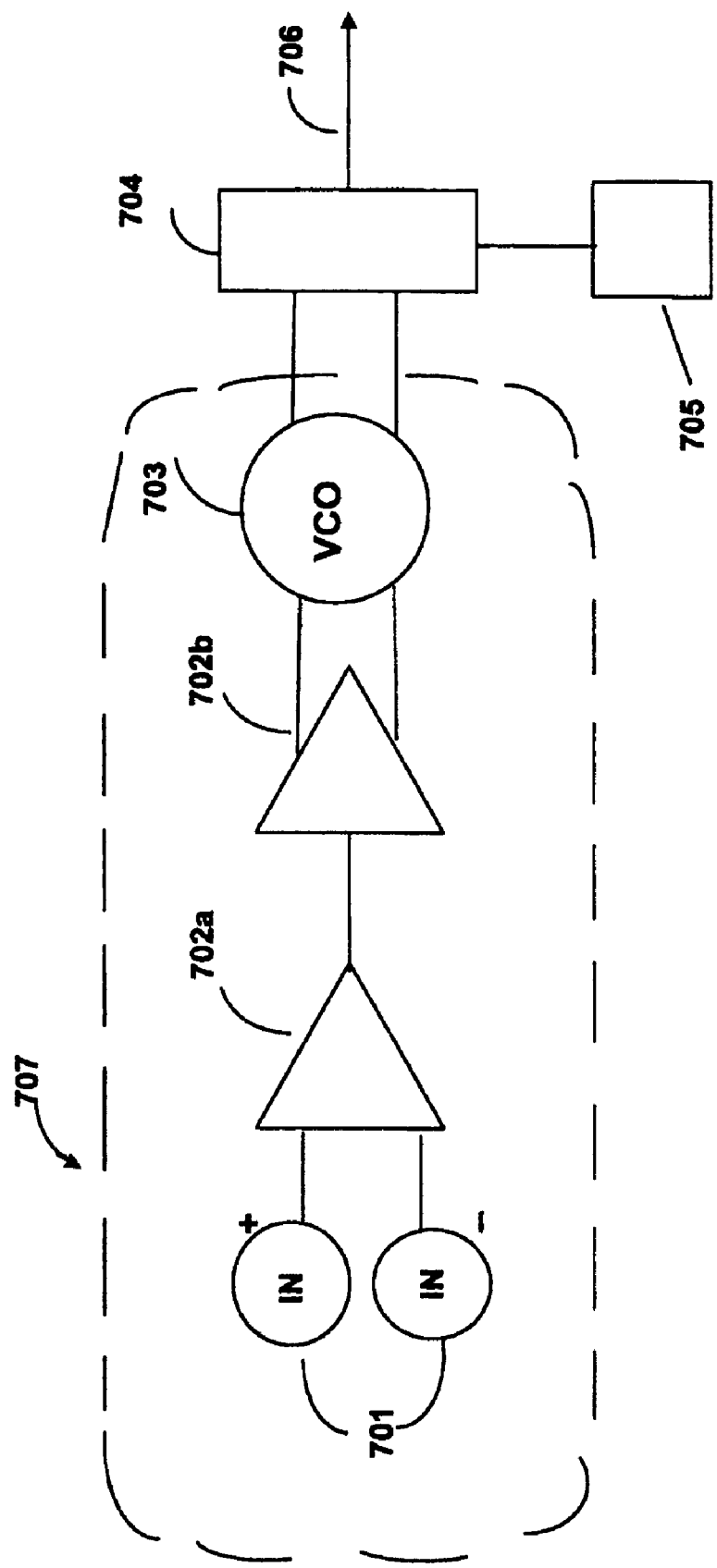
FIGS. 7a-7b are circuit diagrams for an ADC that could be used with the presently described invention.

FIG. 7*a* is a circuit diagram 707 of an ADC that could be used with the previously described inventions, which utilizes differential op amps. The differential op amp system that is shown in FIG. 7*a* has two input sources 701 which are utilized in conjunction with op amps 702*a* and 702*b*, wherein the op amp 702*b* is a voltage to current driver with a selectable gain multiplier. This configuration provides large common mode rejection for a very accurate reproduction of the input signal. The system of FIG. 7*a* further shows a counter 704, a CPU 705, and a digital output signal 706.

Figure 7B:
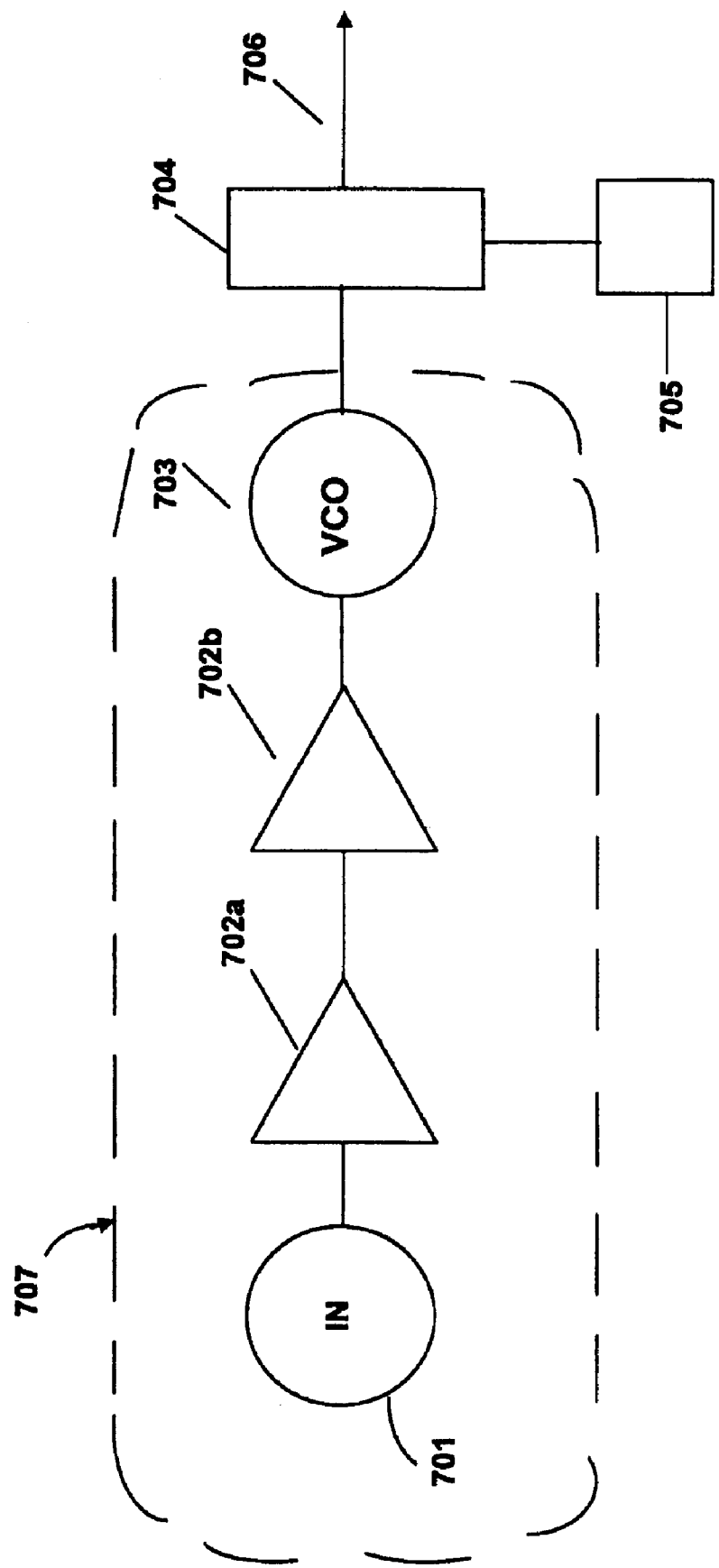

FIG. 7*b* is a circuit diagram 707 of an ADC which comprises a single-ended voltage controlled oscillator 703. The remaining elements are the same as for FIG. 7*a*. The inverter system of FIG. 7*a* has the advantage of separating out the desired input signal 701 to be sampled from the undesirable background noise; FIG. 7*b* has no noise immunity. However, the inverter system of FIG. 7*b* requires only one pin connection, whereas the inverter system of FIG. 7*a* requires two pin connections.

The ADC circuit diagrams of FIGS. 7*a* and 7*b* could be used with any of the previously described ADC/CPU distributed sampling systems for sampling an input analog signal.

The above described ADC/CPU distributed sampling systems could also be integrated with any of various architectures well known to the inventor. One mode for carrying out the invention is through utilizing an array of individual computers. An array is depicted in a diagrammatic view in FIG. 8 and is designated therein by the general reference character 10. The computer array 10 has a plurality (twenty four in the example shown) of computers 12 (sometimes also referred to as "cores" or "nodes" in the example of an array). In the example shown, all of the computers 12 are located on a single die 14. According to the present invention, each of the computers 12 is a generally independently functioning computer, as will be discussed in more detail hereinafter. The computers 12 are interconnected by a plurality (the quantities of which will be discussed in more detail hereinafter) of interconnecting data buses 16. In this example, the data buses 16 are bidirectional asynchronous high speed parallel data buses, although it is within the scope of the invention that other interconnecting means might be employed for the purpose. In the present embodiment of the array 10, not only can data communication between the computers 12 be asynchronous, but the individual computers 12 can also operate in an internally asynchronous mode. The individual computers 12 operate asynchronously, which saves a great deal of power since each computer 12 will use essentially no power when it is not executing instructions, and since there is no clock running therein.

Figure 8:
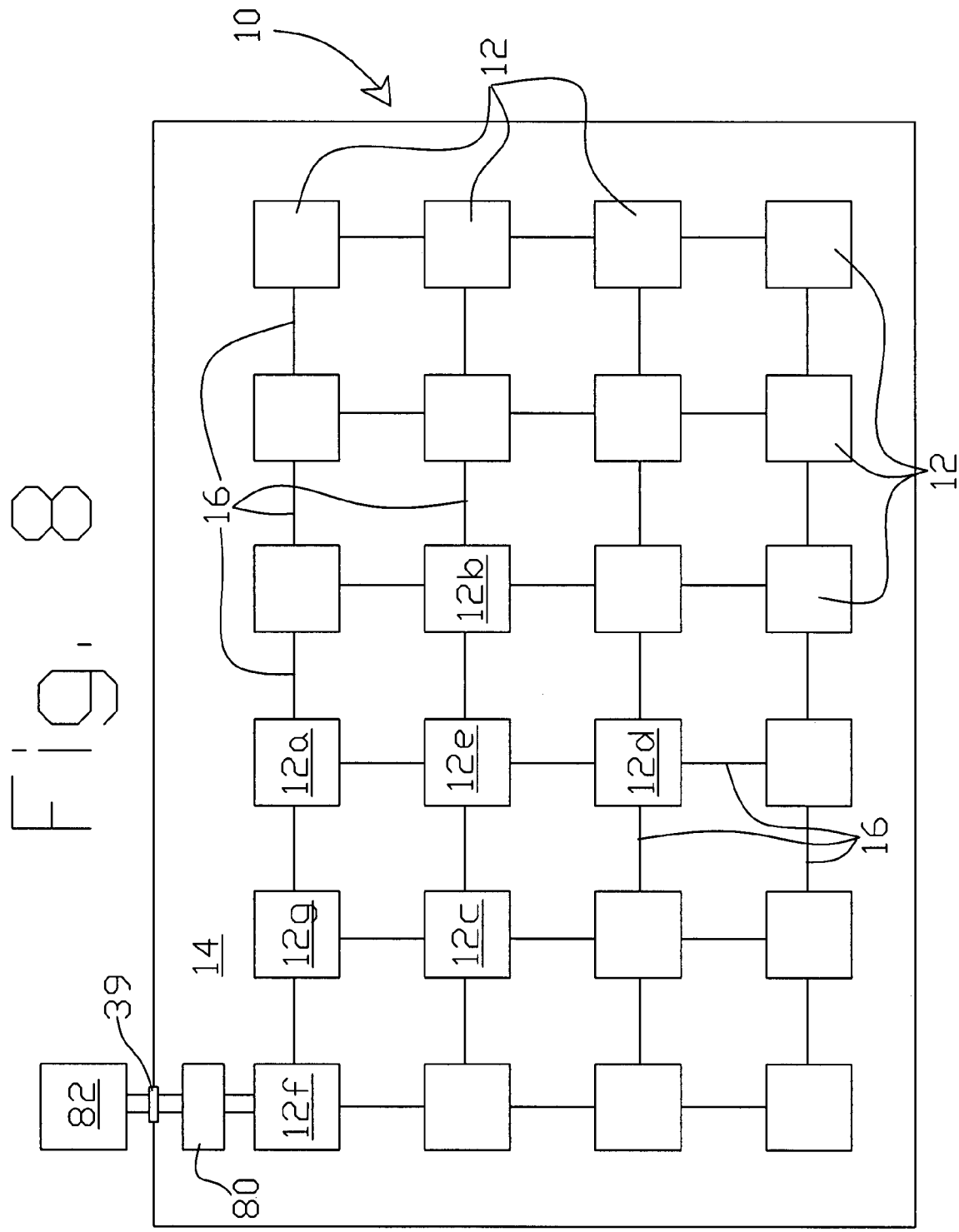
FIG. 8 is a diagrammatic view of a computer array, according to the present invention.

One skilled in the art will recognize that there will be additional components on the die 14 that are omitted from the view of FIG. 8 for the sake of clarity. Such additional components include power buses, external connection pads, and other such common aspects of a microprocessor chip.

Computer 12e is an example of one of the computers 12 that is not on the periphery of the array 10. That is, computer 12e has four orthogonally adjacent computers 12a, 12b, 12c and 12d. This grouping of computers 12a through 12e will be used, by way of example, hereinafter in relation to a more detailed discussion of the communications between the computers 12 of the array 10. As can be seen in the view of FIG. 8, interior computers 12 such as computer 12e will have four other computers 12 with which they can directly communicate via the buses 16. In the following discussion, the principles discussed will apply to all of the computers 12, except that the computers 12 on the edge of the array 10 will be in direct communication with only three other computers 12, and the corner computers 12 will be in direct communication with only two other computers 12.

Figure 9:
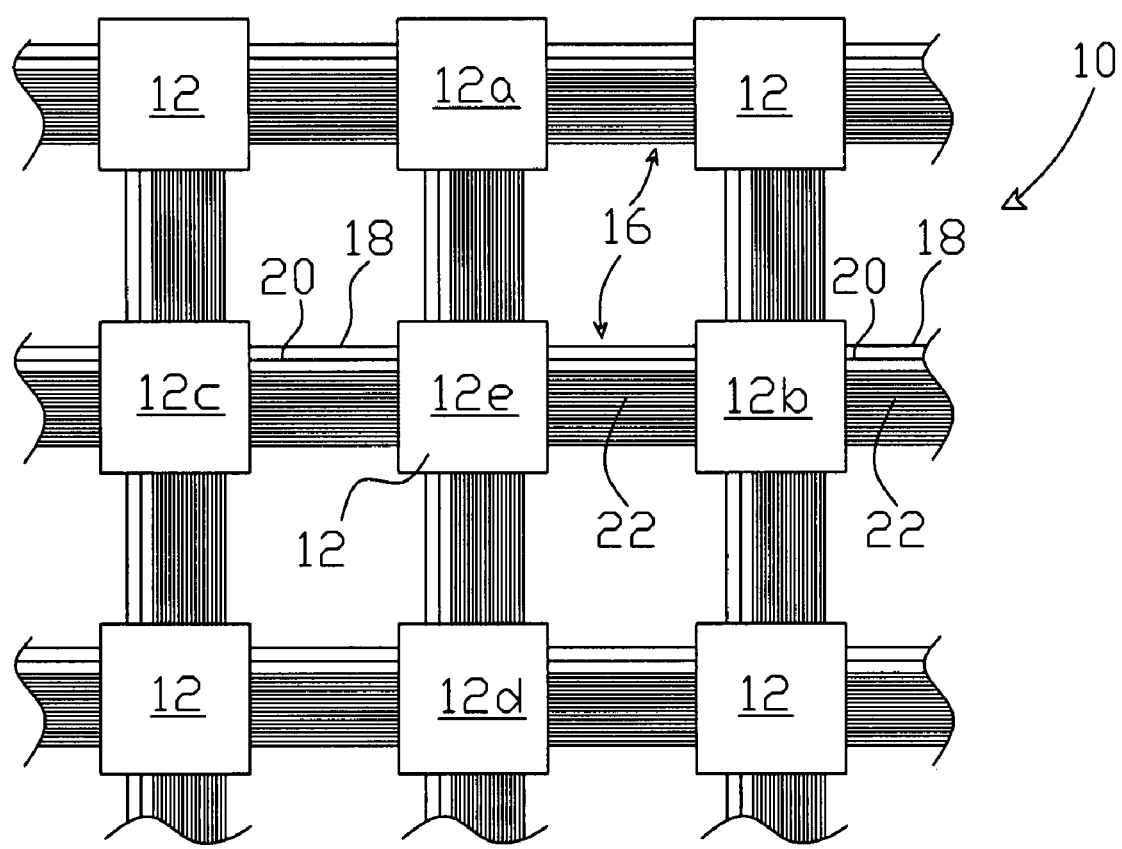
FIG. 9 is a detailed diagram showing a subset of the computers of FIG. 8 and a more detailed view of the interconnecting data buses of FIG. 8.

FIG. 9 is a more detailed view of a portion of FIG. 8 showing only some of the computers 12 and, in particular, computers 12a through 12e, inclusive. The view of FIG. 9 also reveals that the data buses 16 each have a read line 18, a write line 20 and a plurality (eighteen, in this example) of data lines 22. The data lines 22 are capable of transferring all the bits of one eighteen-bit instruction word simultaneously in parallel.

According to the present inventive method, a computer 12, such as the computer 12e can set high one, two, three or all four of its read lines 18 such that it is prepared to receive data from the respective one, two, three or all four adjacent computers 12. Similarly, it is also possible for a computer 12 to set one, two, three or all four of its write lines 20 high.

When one of the adjacent computers 12a, 12b, 12c or 12d sets a write line 20 between itself and the computer 12e high, if the computer 12e has already set the corresponding read line 18 high, then a word is transferred from that computer 12a, 12b, 12c or 12d to the computer 12e on the associated data lines 22. Then, the sending computer 12 will release the write line 20 and the receiving computer (12e in this example) pulls both the write line 20 and the read line 18 low. The latter action will acknowledge to the sending computer 12 that the data has been received. Note that the above description is not intended necessarily to denote the sequence of events in order. In actual practice, the receiving computer may try to set the write line 20 low slightly before the sending computer 12 releases (stops pulling high) its write line 20. In such an instance, as soon as the sending computer 12 releases its write line 20, the write line 20 will be pulled low by the receiving computer 12e.

Whenever a computer 12 such as the computer 12e has set one of its write lines 20 high in anticipation of writing it will simply wait, using essentially no power, until the data is "requested", as described above, from the appropriate adjacent computer 12, unless the computer 12 to which the data is to be sent has already set its read line 18 high, in which case the data is transmitted immediately. Similarly, whenever a computer 12 has set one or more of its read lines 18 to high in anticipation of reading it will simply wait, using essentially no power, until the write line 20 connected to a selected computer 12 goes high to transfer an instruction word between the two computers 12.

As discussed above, there may be several potential means and/or methods to cause the computers 12 to function as described. However, in this present example, the computers 12 so behave simply because they are operating generally asynchronously internally (in addition to transferring data there-between in the asynchronous manner described). That is, instructions are generally completed sequentially. When either a write or read instruction occurs, there can be no further action until that instruction is completed (or, perhaps alternatively, until it is aborted, as by a "reset" or the like). There is no regular clock pulse, in the prior art sense. Rather, a pulse is generated to accomplish a next instruction only when the instruction being executed either is not a read or write type instruction (given that a read or write type instruction would require completion, often by another entity) or else when the read or write type operation is, in fact, completed.

Figure 10:
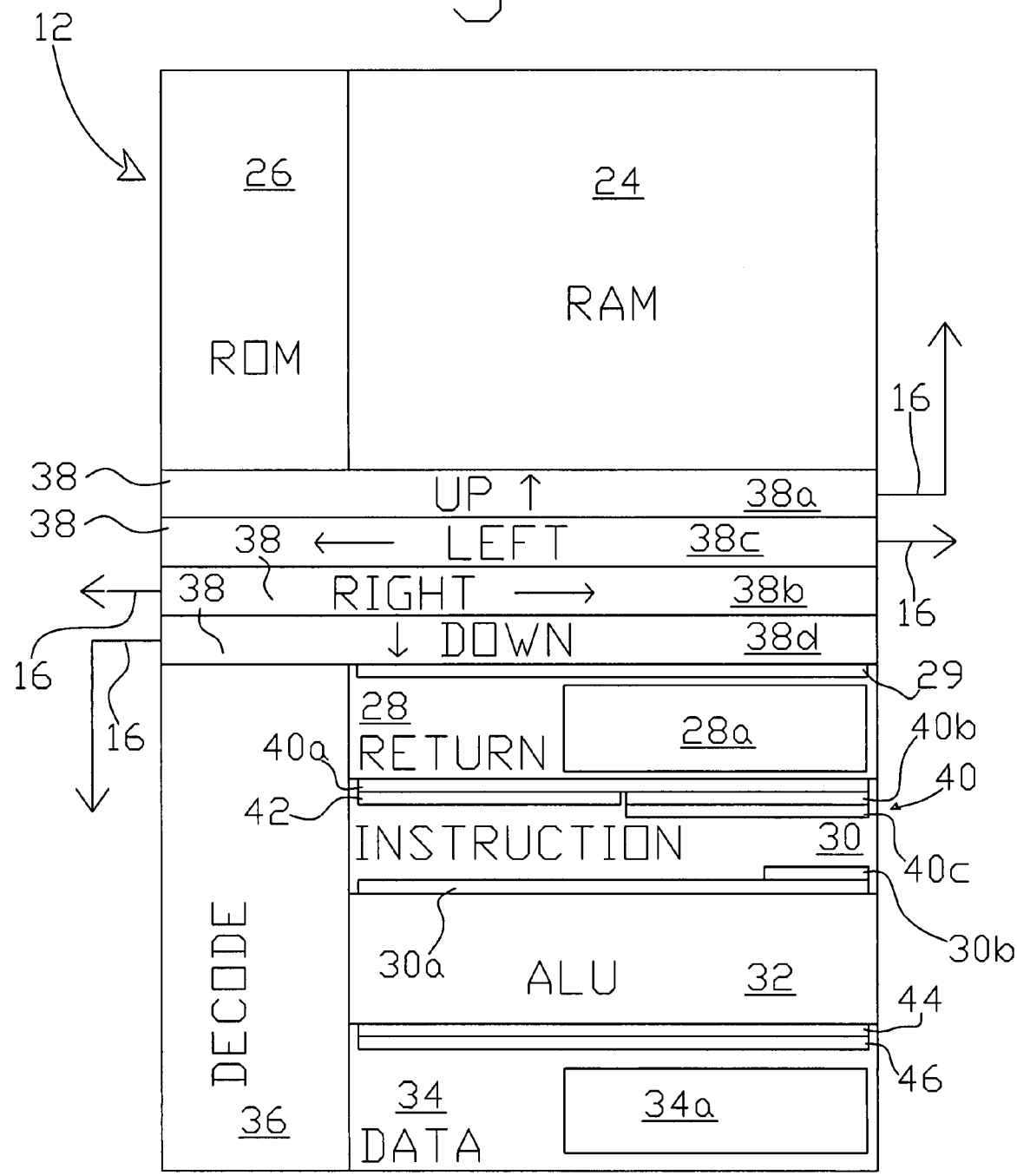
FIG. 10 is a block diagram depicting a general layout of a stack computer.

FIG. 10 is a block diagram depicting the general layout of an example of one of the computers 12 of FIGS. 8 and 9. As can be seen in the view of FIG. 10, each of the computers 12 is a generally self contained computer having its own RAM 24 and ROM 26. As mentioned previously, the computers 12 are also sometimes referred to as individual "nodes", given that they are, in the present example, combined on a single chip.

Other basic components of the computer 12 are a return stack 28 including an R register 29, an instruction area 30, an arithmetic logic unit ("ALU" or "processor") 32, a data stack 34 and a decode logic section 36 for decoding instructions. One skilled in the art will be generally familiar with the operation of stack based computers such as the computers 12 of this present example. The computers 12 are dual stack computers having the data stack 34 and the separate return stack 28.

In this embodiment of the invention, the computer 12 has four communication ports 38 for communicating with adjacent computers 12. The communication ports 38 are further defined by the up port 38a, the right port 38b, the left port 38c, and the down port 38d. The communication ports 38 are tri-state drivers, having an off status, a receive status (for driving signals into the computer 12) and a send status (for driving signals out of the computer 12). If the particular computer 12 is not on the interior of the array (FIG. 8) such as the example of computer 12e, then one or more of the communication ports 38 will not be used in that particular computer, at least for the purposes described above. However, those communication ports 38 that do abut the edge of the die 14 can have additional circuitry, either designed into such computer 12 or else external to the computer 12 but associated therewith, to cause such communication port 38 to act as an external I/O port 39 (FIG. 8). Examples of such external I/O ports 39 include, but are not limited to, USB (universal serial bus) ports, RS232 serial bus ports, parallel communications ports, analog to digital and/or digital to analog conversion ports, and many other possible variations. No matter what type of additional or modified circuitry is employed for this purpose, according to the presently described embodiment of the invention, the method of operation of the "external" I/O ports 39 regarding the handling of instructions and/or data received there from will be alike to that described, herein, in relation to the "internal" communication ports 38. In FIG. 8 an "edge" computer 12f is depicted with associated interface circuitry 80 (shown in block diagrammatic form) for communicating through an external I/O port 39 with an external device 82.

In the presently described embodiment, the instruction area 30 includes a number of registers 40 including, in this example, an A register 40a, a B register 40b and a P register 40c. In this example, the A register 40a is a full eighteen-bit register, while the B register 40b and the P register 40c are nine-bit registers. Also depicted in block diagrammatic form in the view of FIG. 10 is a slot sequencer 42.

The data stack 34 and the return stack 28 are not arrays in memory accessed by a stack pointer, as in many prior art computers. Rather, the stacks 34 and 28 are an array of registers. The top two registers in the data stack 34 are a T register 44 and an S register 46. The remainder of the data stack 34 has a circular register array 34a having eight additional hardware registers therein numbered, in this example $S_2$ through $S_9$. One of the eight registers in the circular register array 34a will be selected as the register below the S register 46 at any time. The value in the shift register that selects the stack register to be below S cannot be read or written by software. Similarly, the top position in the return stack 28 is the dedicated R register 29, while the remainder of the return stack 28 has a circular register array 28a having eight additional hardware registers therein (not specifically shown in the drawing) that are numbered, in this example $R_1$ through $R_8$.

In addition to the registers previously discussed herein, the instruction area 30 also has an 18 bit instruction register 30a for storing an instruction word that is presently being used, and an additional 5 bit opcode register 30b for the particular instruction word presently being executed.

The previously described ADC/CPU distributed sampling systems could be integrated with the above described computer array, resulting in numerous system combinations of different type, size, and purpose. In addition, such systems could be processed as individual discrete components integrated together onto a substrate, or processed completely on a single chip, or a combination of the two processes.

Figure 11A:
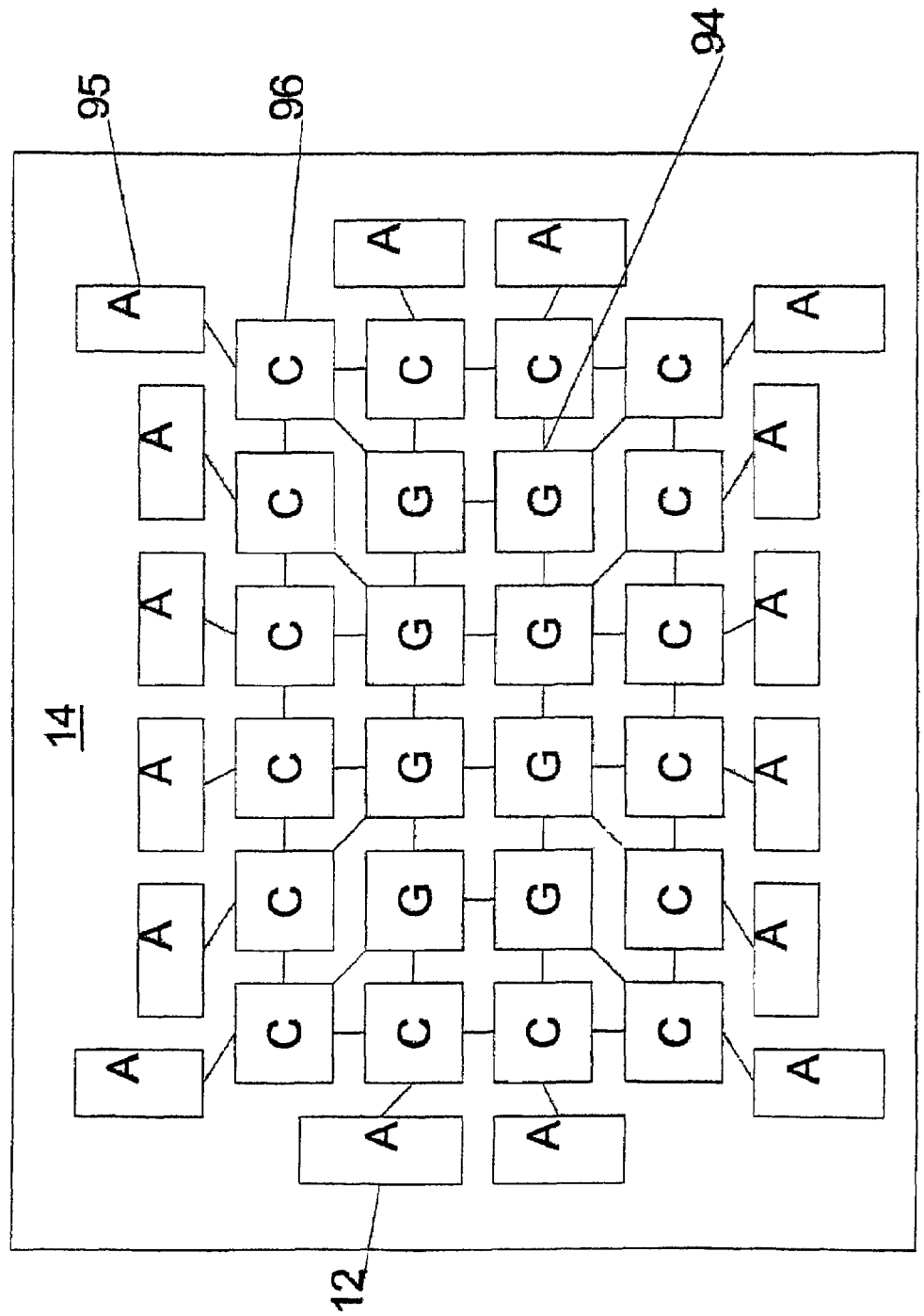
FIGS. 11a-11c are diagrammatic views of an ADC and computer system array according to the present invention.

The following description will give two examples of different ADC array possibilities, which are given to further clarify the present invention and are not to be construed as limiting features. FIG. 11a shows a chip or die 14 with several computers or nodes 12. The interior computers 12 are designated as general purpose computers (G) 94, which are interconnected and therefore, can share resources there between as previously described. The periphery of the die 14 contains several ADCs (A) 95. Each ADC (A) 95 has a dedicated computer, referred to as an ADC computer (C) 96. Each ADC computer (C) 96 has access to any or all of the general purpose computers (G) 94. The connections between the ADC computers (C) 96 may or may not be utilized.

Figure 11B:
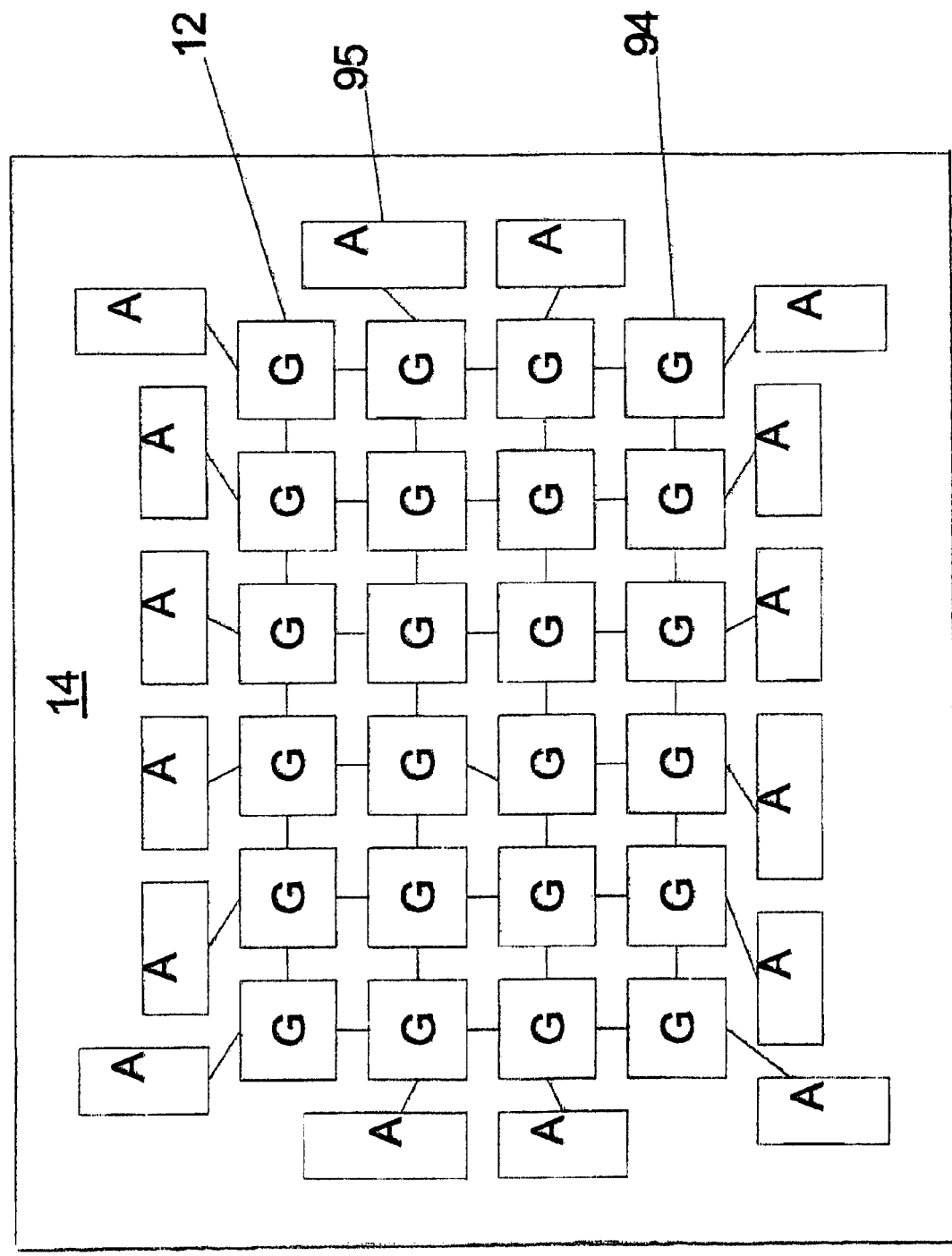

FIG. 11b shows another embodiment of a die 14 with several computers 12. ADCs (A) 95 are formed at the periphery of the die 14, but there are no dedicated ADC computers (C) 96 as in FIG. 11a. Each ADC (A) 95 would have direct access to any or all of the interconnected general purpose computers (G) 94.

Figure 11C:
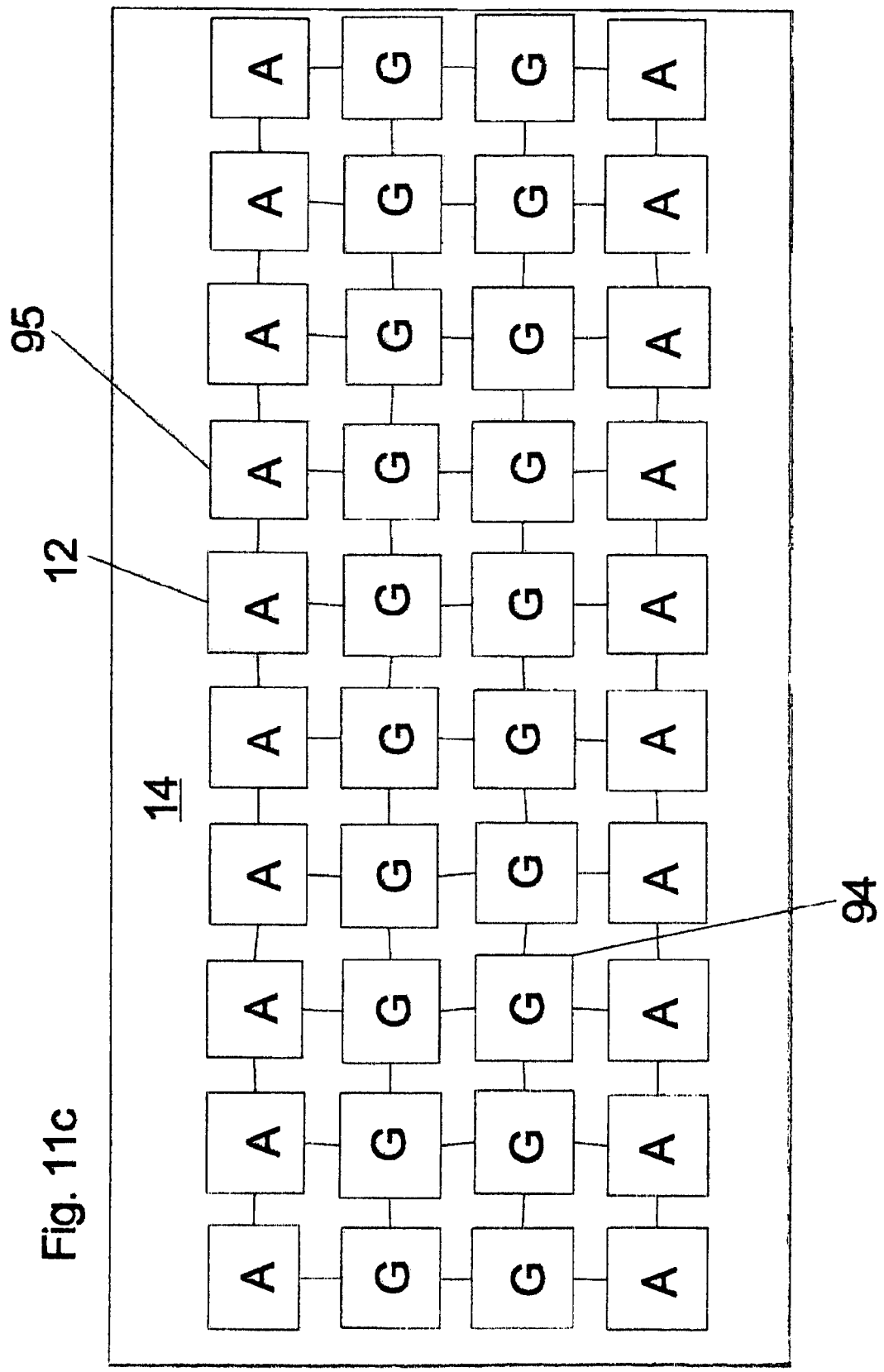

FIG. 11c shows a die 14 with a total of forty computers 12, wherein 20 computers 12 are ADCs (A) 95 and 20 computers 12 are general purpose computers (G) 94. FIG. 11c is an example of a die 14 which could be utilized in the previous examples of sampling a 10 GHz input analog signal. Each individual ADC was capable of sampling at a rate of 1 gsps; therefore, 20 such ADCs (A) 95 and 20 associated general purpose computers (G) 94 would be necessary to sample a 10 GHz input analog signal.

All of the above examples are only some of the examples of available embodiments of the present invention. Those skilled in the art will readily observe that numerous other modifications and alterations may be made without departing from the spirit and scope of the invention. Accordingly, the disclosure herein is not intended as limiting and the appended claims are to be interpreted as encompassing the entire scope of the invention.

We claim:

1. A method of sampling an analog signal, comprising:
   providing an input analog signal;
   routing a timing signal through a distributed sampling system;
   sampling said input analog signal a plurality of times using a plurality of analog-to-digital converters (ADCs), respectively; and
   combining each of said plurality of input analog signal samplings to form a single contiguous digital output signal, wherein:
   said distributed sampling system provides a plurality of sequential sampling prompts.

2. The method of claim 1, further comprising:
   providing a plurality of central processing units (CPUs) connected to said plurality of ADCs, respectively.

3. The method of claim 2, wherein:
   some of said plurality of CPUs are dedicated to their respective connected ADCs.

4. The method of claim 2, wherein:
   some of said plurality of CPUs are general purpose CPUs.

5. The method of claim 1, wherein:
   said plurality of sequential sampling prompts causes each of said samplings to occur after an amount of time from a most recent preceding sampling.

6. The method of claim 1, wherein:
   each of said plurality of sequential sampling prompts causes each of said samplings to occur in sequence.

7. The method of claim 1, wherein:
   each of said plurality of sequential sampling prompts corresponds respectively to each of said samplings.

8. The method of claim 1, wherein:
   said combining of samplings supports a Fourier Transformation function.

9. The method of claim 1, wherein:
   each of said plurality of ADCs is capable of sampling at a pre-determined sampling rate; and
   said method is equivalent to using a single ADC which is capable of sampling at a rate of said pre-determined sampling rate multiplied by a total number of ADCs used.

10. An analog-to-digital converter (ADC) sampling system, comprising:
    a plurality of analog-to-digital converters (ADCs); and
    a distributed sampling system, comprising:
      a plurality of distribution stations which are connected together in series to form a junction between each of said stations; and
      a plurality of tap lines connected between each of said junctions and each of said plurality of ADCs, respectively.

11. The ADC system of claim 10, further comprising:
    an input analog signal; and
    a timing signal.

12. The ADC system of claim 10, further comprising:
    a plurality of central processing units (CPUs) connected to said plurality of ADCs, respectively.

13. The ADC system of claim 12, wherein:
some of said plurality of CPUs are dedicated to their respective connected ADCs.

14. The ADC system of claim 12, wherein:
some of said plurality of CPUs are general purpose CPUs.

15. The ADC system of claim 10, wherein:
some of said plurality of ADCs comprise:
a differential op amp system.

16. The ADC system of claim 15, wherein:
said differential op amp system comprises:
two input sources;
an op amp; and
a voltage controlled oscillator (VCO).

17. The ADC system of claim 15, wherein:
said differential op amp system produces a common mode rejection ratio.

18. The ADC system of claim 15, wherein:
said differential op amp system provides a reduction of noise signals.

19. A method of sampling an analog signal using a distributed sampling system, comprising:
providing a plurality of conductive trace patterns which are connected together in series to form a junction between each of said patterns;
routing a timing signal through said plurality of conductive trace patterns;
providing a plurality of sequential sampling prompts at each of said junctions;
sampling an input analog signal using a plurality of analog-to-digital converters (ADCs); and
combining each of said input analog signal samplings to form a single contiguous digital output signal.

20. The method of claim 19, further comprising:
providing a plurality of central processing units (CPUs) connected to said plurality of ADCs, respectively.

21. The method of claim 20, wherein some of said plurality of CPUs are dedicated to their respective connected ADCs.

22. The method of claim 20, wherein some of said plurality of CPUs are general purpose CPUs.

23. The method of claim 19, wherein:
said plurality of sequential sampling prompts causes each of said samplings to occur after an amount of time from a most recent preceding sampling.

24. The method of claim 19, wherein:
each of said plurality of sequential sampling prompts causes each of said samplings to occur in sequence.

25. The method of claim 19, wherein:
each of said plurality of sequential sampling prompts corresponds respectively to each of said samplings.

26. The method of claim 19, wherein:
said combining of samplings supports a Fourier Transformation function.

27. The method of claim 19, wherein:
each of said plurality of ADCs is capable of sampling at a pre-determined sampling rate; and
said method is equivalent to using a single ADC which is capable of sampling at a rate of said pre-determined sampling rate multiplied by a total number of ADCs used.

28. A method of sampling an analog signal using a distributed sampling system, comprising:
providing a device comprised of a specific permittivity material;
routing a timing signal through said device;
providing a plurality of sequential sampling prompts at a plurality of equi-distant points along said device, respectively;
sampling an input analog signal using a plurality of analog-to-digital converters (ADCs); and
combining each of said input analog signal samplings to form a single contiguous digital output signal.

29. The method of claim 28, further comprising:
providing a plurality of central processing units (CPUs) connected to said plurality of ADCs, respectively.

30. The method of claim 29, wherein some of said plurality of CPUs are dedicated to their respective connected ADCs.

31. The method of claim 29, wherein some of said plurality of CPUs are general purpose CPUs.

32. The method of claim 28, wherein:
said plurality of sequential sampling prompts causes each of said samplings to occur after an amount of time from a most recent preceding sampling.

33. The method of claim 28, wherein:
each of said plurality of sequential sampling prompts causes each of said samplings to occur in sequence.

34. The method of claim 28, wherein:
each of said plurality of sequential sampling prompts corresponds respectively to each of said samplings.

35. The method of claim 28, wherein:
said combining of samplings supports a Fourier Transformation function.

36. The method of claim 28, wherein:
each of said plurality of ADCs is capable of sampling at a pre-determined sampling rate; and
said method is equivalent to using a single ADC which is capable of sampling at a rate of said pre-determined sampling rate multiplied by a total number of ADCs used.

37. A method of sampling an analog signal using a distributed sampling system, comprising:
providing a sequencer device comprised of a plurality of triggers, which are connected to a plurality of analog-to-digital converters (ADCs), respectively;
inputting a plurality of timing signal pulses into said plurality of triggers, respectively;
sampling an input analog signal a plurality of times using said plurality of ADCs, respectively; and
combining each of said samplings to form a single contiguous digital output signal.

38. The method of claim 37, further comprising:
providing a plurality of central processing units (CPUs) connected to said plurality of ADCs, respectively.

39. The method of claim 38, wherein some of said plurality of CPUs are dedicated to their respective connected ADCs.

40. The method of claim 38, wherein some of said plurality of CPUs are general purpose CPUs.

41. The method of claim 37, wherein:
said plurality of sequential sampling prompts causes each of said samplings to occur after an amount of time from a most recent preceding sampling.

42. The method of claim 37, wherein:
each of said plurality of sequential sampling prompts causes each of said samplings to occur in sequence.

43. The method of claim 37, wherein:
each of said plurality of sequential sampling prompts corresponds respectively to each of said samplings.

44. The method of claim 37, wherein:
said combining of samplings supports a Fourier Transformation function.

45. The method of claim 37, wherein:
each of said plurality of ADCs is capable of sampling at a pre-determined sampling rate; and said method is equivalent to using a single ADC which is capable of sampling at a rate of said pre-determined sampling rate multiplied by a total number of ADCs used.

46. The method of claim 37, further comprising:
a clock generating block.

47. The method of claim 46, wherein:
said clock generating block comprises a ring oscillator.

48. A method of sampling an analog signal using a distributed sampling system, comprising:
providing a plurality of inverter pairs which are connected together in series to form a junction between each of said plurality of inverter pairs;
routing a timing signal through said plurality of inverter pairs;
providing a plurality of sequential sampling prompts at each of said junctions;
sampling an input analog signal using a plurality of analog-to-digital converters (ADCs); and
combining each of said input analog signal samplings to form a single contiguous digital output signal.

49. The method of claim 48, further comprising:
a plurality of central processing units (CPUs) connected to said plurality of ADCs, respectively.

50. The method of claim 49, wherein some of said plurality of CPUs are dedicated to their respective connected ADCs.

51. The method of claim 49, wherein some of said plurality of CPUs are general purpose CPUs.

52. The method of claim 48, wherein:
said plurality of sequential sampling prompts causes each of said samplings to occur after an amount of time from a most recent preceding sampling.

53. The method of claim 48, wherein:
each of said plurality of sequential sampling prompts causes each of said samplings to occur in sequence.

54. The method of claim 48, wherein:
each of said plurality of sequential sampling prompts corresponds respectively to each of said samplings.

55. The method of claim 48, wherein:
said combining of samplings supports a Fourier Transformation function.

56. The method of claim 48, wherein:
each of said plurality of ADCs is capable of sampling at a pre-determined sampling rate; and
said method is equivalent to using a single ADC which is capable of sampling at a rate of said pre-determined sampling rate multiplied by a total number of ADCs used.

57. A multiple core processor, comprising:
a plurality of interconnected central processing units (CPUs);
a plurality of analog-to-digital converters (ADCs) connected to said plurality of CPUs; and
a distributed sampling system, comprising:
a plurality of distribution stations which are connected together in series to form a junction between each of said stations; and
a plurality of tap lines connected between each of said junctions and each of said plurality of ADCs, respectively.

58. The processor of claim 57, wherein:
some of said plurality of CPUs are dedicated to their respective connected ADCs.

59. The processor of claim 57, wherein:
some of said plurality of CPUs are general purpose CPUs.

60. The processor of claim 57, wherein:
some of said plurality of ADCs comprise a differential op amp system.

61. The processor of claim 57, wherein:
an output of said processor comprises an accumulation of sequential input analog signal samplings.

62. The processor of claim 61, wherein:
said output comprises a digital output signal.

* * * * *